United States Patent
Takano

(10) Patent No.: US 12,294,355 B2
(45) Date of Patent: May 6, 2025

(54) SEMICONDUCTOR INTEGRATED CIRCUIT DEVICE

(71) Applicant: Yoichi Takano, Hadano (JP)

(72) Inventor: Yoichi Takano, Hadano (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 12 days.

(21) Appl. No.: 17/543,587

(22) Filed: Dec. 6, 2021

(65) Prior Publication Data

US 2022/0182049 A1    Jun. 9, 2022

(30) Foreign Application Priority Data

Dec. 4, 2020    (JP) ................................. 2020-201399

(51) Int. Cl.
  *H02H 3/087* (2006.01)
  *G05F 1/573* (2006.01)
  *H03K 17/082* (2006.01)

(52) U.S. Cl.
  CPC ......... *H03K 17/0822* (2013.01); *G05F 1/573* (2013.01); *H02H 3/087* (2013.01); *H03K 2217/0027* (2013.01)

(58) Field of Classification Search
  CPC ........ H02H 3/025; H02H 3/087; H02H 9/025; H02H 9/001; H02H 9/02; H03K 17/0822
  See application file for complete search history.

(56) References Cited

U.S. PATENT DOCUMENTS

| | | | |
|---|---|---|---|
| 7,848,071 B2 | 12/2010 | Takahashi | |
| 2008/0055808 A1* | 3/2008 | Burkland | H02H 3/087 361/94 |
| 2009/0116161 A1* | 5/2009 | Takahashi | H03K 17/687 361/100 |
| 2020/0203943 A1* | 6/2020 | Shen | H02H 3/066 |

FOREIGN PATENT DOCUMENTS

| | | |
|---|---|---|
| JP | 201285382 A | 4/2012 |
| JP | 2013-165603 A | 8/2013 |

OTHER PUBLICATIONS

Notice of Reasons for Refusal (PatentsApplication2020-201399), dated Aug. 27, 2024.

* cited by examiner

*Primary Examiner* — Jared Fureman
*Assistant Examiner* — Christopher J Clark
(74) *Attorney, Agent, or Firm* — Shih IP Law Group, PLLC.

(57) ABSTRACT

A semiconductor integrate circuit device includes: an output transistor connected between a voltage input terminal to which a DC voltage is input and a voltage output terminal; a control circuit that controls on/off of the output transistor; a proportional current generation circuit capable of generating a current proportionally smaller than a current flowing through the output transistor; an overcurrent detection circuit capable of detecting an overcurrent state of an output current by determining whether a current flowing through the output transistor is equal to or greater than a first predetermined current value, based on the current generated by the proportional current generation circuit; and a retry circuit that generates and outputs a signal for intermittently turning off the output transistor in response to the overcurrent detection circuit detecting the overcurrent state.

18 Claims, 5 Drawing Sheets

SEMICONDUCTOR INTEGRATED CIRCUIT DEVICE

CROSS-REFERENCE TO RELATED APPLICATIONS

The entire disclosure of Japanese Patent Application No. 2020-201399 filed on Dec. 4, 2020 is incorporated herein by reference in its entirety.

BACKGROUND

The present disclosure relates to a technology that is effectively applied to a semiconductor integrated circuit device (IC), such as a high-side switch IC or a linear regulator IC (power supply IC), that includes: a switch or output transistor connected between a voltage input terminal and an output terminal; and an overcurrent protection circuit that protects the transistor from overcurrent.

BACKGROUND ART

There is known a power supply IC constituting a linear regulator. Examples of such a power supply IC include a high-side switch IC that is connected between a power supply and a load and configured to supply/shut down the power-supply voltage to the load, and an IC that controls a transistor provided between a DC voltage input terminal and an output terminal to output a DC voltage with a desired potential.

A high-side switch IC and power supply IC may include an overcurrent protection circuit that protects the transistor from an overcurrent.

Known overcurrent protection circuits include a circuit that has a dropping characteristic as shown in FIG. 5A and a circuit that has a foldback characteristic as shown in FIG. 5B. Known overcurrent protection circuits further include a circuit that automatically returns to a steady state when the overcurrent state is resolved and a circuit that keeps shutting down current once detecting an overcurrent state (latch off function).

JP2012-85382A discloses an invention that relates to an overcurrent protection circuit provided to protect, from overcurrent, a transistor that is connected between a power supply and a load and that supplies/shuts down the power supply voltage to the load.

SUMMARY

When the overcurrent protection circuit with a dropping characteristic shown in FIG. 5A is short-circuited at the output side, the power dissipation may exceed the allowable power dissipation. On the other hand, when the overcurrent protection circuit with a foldback characteristic shown in FIG. 5B is half short-circuited, the circuit may keep flowing a large current, and the power dissipation may exceed the allowable power dissipation. When the power dissipation exceeds the allowable power dissipation, an overheat protection function is typically activated to shut down the output current.

A circuit with a typical overheat protection function may shut down the current when temperature of the junction (jointed surface of the chip) reaches 150° C. and may return to a normal state when the junction temperature is 100° C. In such a case, the junction temperature is around 100 to 150° C. This does not cause a problem when an instant short circuit occurs. However, when a continuous short circuit occurs at the load, the junction temperature may be kept equal to or higher than 100° C. This may shorten life of the device or damage the circuit elements.

The present invention has been conceived in view of the above issue. Objects of the present invention include providing a semiconductor integrated circuit device (e.g., high-side switch IC or a power supply IC) that includes an overcurrent protection circuit and a transistor connected between a voltage input terminal and an output terminal and that is capable of shutting down the output current before the power dissipation exceeds the allowable power dissipation, without relying on the overheat protection function.

The objects of the present invention further include providing a semiconductor integrated circuit device capable of automatically returning to its steady state when the overcurrent state is resolved.

The objects of the present invention further include providing a semiconductor integrated circuit device that does not wrongly detect a temporal rush current as an overcurrent and shut down the output current. The temporal rush current flows and charges a stabilizing capacitor connected to the output terminal until the voltage across the capacitor reaches a predetermined voltage, when the device is activated and the output transistor is turned on.

In order to achieve at least one of the above objects, according to an aspect of the present invention, there is provided a semiconductor integrate circuit device including: an output transistor connected between a voltage input terminal to which a DC voltage is input and a voltage output terminal; a control circuit that controls on/off of the output transistor; a proportional current generation circuit capable of generating a current proportionally smaller than a current flowing through the output transistor; an overcurrent detection circuit capable of detecting an overcurrent state of an output current by determining whether a current flowing through the output transistor is equal to or greater than a first predetermined current value, based on the current generated by the proportional current generation circuit; and a retry circuit that generates and outputs a signal for intermittently turning off the output transistor in response to the overcurrent detection circuit detecting the overcurrent state.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, preferred embodiments of the present invention are described with reference to the drawings.

First Embodiment

Figure 1:
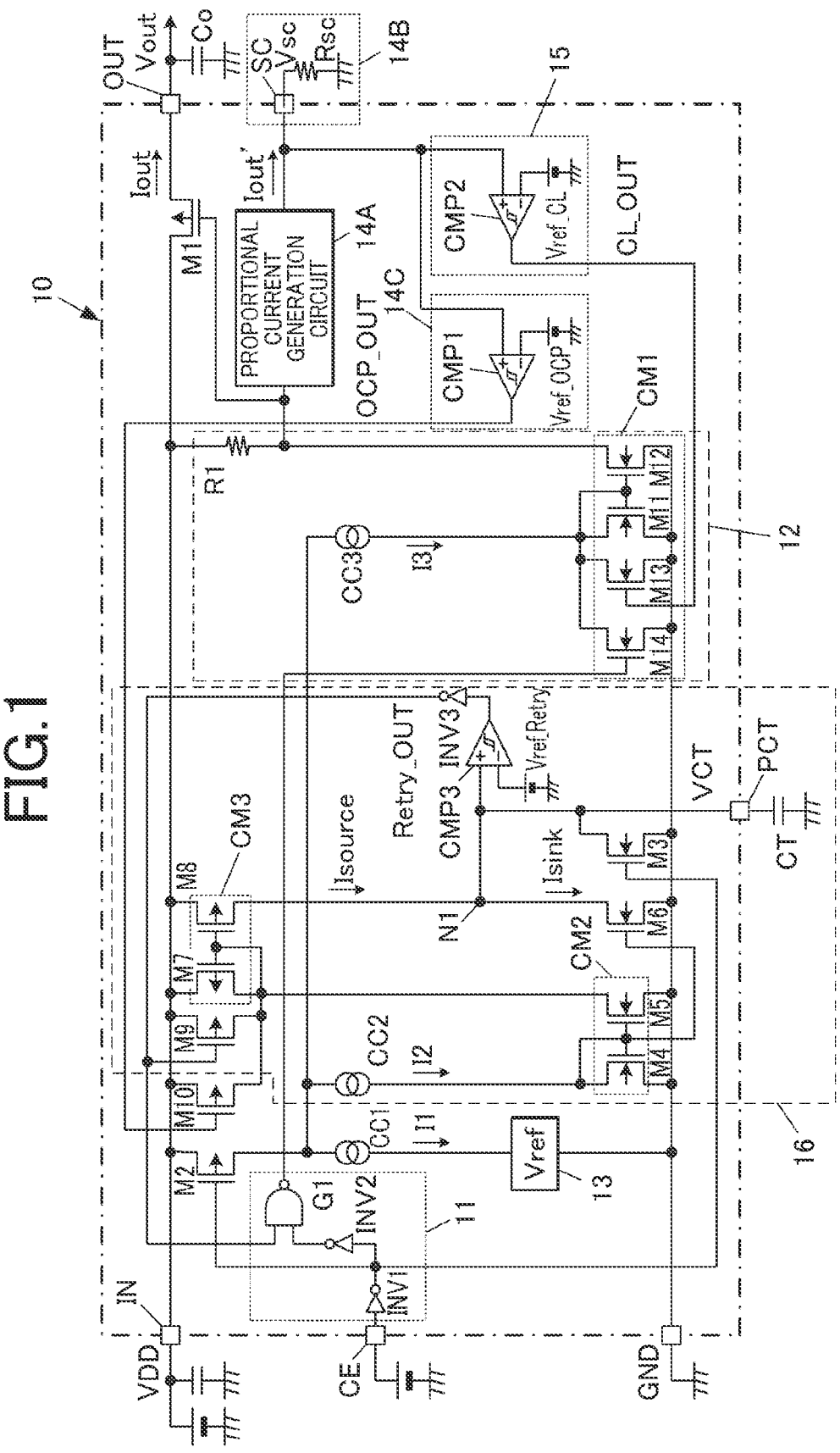
FIG. 1 is a circuit configuration of a high-side switch IC as an embodiment of the present invention.

FIG. 1 is an embodiment of a high-side switch IC to which the present invention is applied. In FIG. 1, the part enclosed by the alternate long and short dash line is a semiconductor integrated circuit (IC) 10 formed on a semiconductor chip, such as a single crystal silicon. The output terminal OUT of the IC 10 is connected to a capacitor Co that stabilizes outputs.

As shown in FIG. 1, the high-side switch IC 10 in this embodiment includes a switching P-channel MOS transistor M1 connected between a voltage input terminal IN to which a DC voltage VDD is applied and an output terminal OUT. The IC 10 further includes: a terminal CE to which signals are input by, for example, an external microcomputer (central processing unit, CPU) that controls the chip; a logic circuit 11 that receives the potential of the terminal CE as an input; and a control circuit 12 that generates a gate control signal for the transistor M1 according to the output by the logic circuit 11. The control circuit 12 generates the gate control signal for turning on/off the transistor M1 according to the potential of the terminal CE.

The control circuit 12 includes: a current mirror circuit CM1 that consists of N-channel MOS transistors M11 to M14 and that has the on-off function according to the output signal of the logic circuit 11; a P-channel MOS transistor M2 and a constant current source CC3 that are connected in series to the primary-side transistor M11 of the current mirror circuit CM1; and a resistor R1 that is connected in series to the secondary-side transistor M12 of the current mirror circuit CM1 and that converts currents into voltages. The transistors M13 and M14 are on-off transistors. The logic circuit 11 includes: an inverter INV1 that inverts the logic potential of the terminal CE for controlling the chip; an inverter INV2 that inverts the output of the inverter INV1; and a NAND gate G1 that receives, as inputs, the output of the inverter INV1 and the signal from a retry circuit 16 (described later).

In the control circuit 12, when the transistor M14 is turned on by the output of the logic circuit 11, the current I3 from the constant current source CC3 flows through the transistor M14, so that the transistors M11, M12 are turned off. Accordingly, currents do not flow through the resistor R1. The DC voltage VDD is then applied via the resistor R1 to the gate terminal of the transistor M1, so that the transistor M1 is turned off. On the other hand, when the transistor M14 is turned off by the output of the logic circuit 11, the current I3 from the constant current source CC3 flows through the transistor M11, so that a current flows through the transistor M12 and the resistor R1. The voltage lowered by the resistor R1 is applied to the gate terminal of the transistor M1, and the transistor M1 is turned on.

The high-side switch IC 10 in this embodiment further includes a reference voltage circuit 13 that generates the reference voltage Vref; and a constant current source CC1 that is connected in series to the transistor M2 and that flows an operation current to the reference voltage circuit 13. The reference voltage circuit 13 can be constituted of a bandgap, resistors in series, or a Zener diode.

The high-side switch IC 10 in this embodiment further includes: an overcurrent protection circuit 14; a comparator (voltage comparator circuit) CMP2 constituting a current limit circuit 15 that limits the output current Iout; a retry circuit 16; and a switch transistor M10 that controls on/off of a current circuit of the retry circuit 16 according to the output of the overcurrent protection circuit 14.

The overcurrent protection circuit 14 includes: a proportional current generation circuit 14A that generates a current Iout' being proportional to the output current Iout flown by the transistor M1 toward the output terminal OUT; a current-voltage conversion circuit 14B that converts the generated current Iout' into a voltage; and an overcurrent detection circuit 14C that detects the overcurrent state on the basis of the converted voltage. The output OCP-OUT of the overcurrent detection circuit 14C is input to the gate terminal of the switch transistor M10.

The IC 10 further includes an external terminal SC for flowing the current Iout' generated by the proportional current generation circuit 14A to the outside of the chip. The current-voltage conversion circuit 14B is constituted of the external terminal SC and an external resistor element Rsc connected between the external terminal SC and a grounding point. The overcurrent detection circuit 14C is constituted of a comparator CMP1 that compares the voltage Vsc converted by the resistor element Rsc and a predetermined reference voltage Vref_OCP. The comparators CMP1, CMP2 have hysteresis. The resistor element Rsc may be an on-chip element.

The comparator CMP2 constituting the current limit circuit 15 receives the voltage converted by the resistor element Rsc and a predetermined reference voltage Vref_CL as inputs. When the current Iout', namely the output current Iout, exceeds a predetermined current value, the output CL_OUT of the comparator CMP2 becomes high level. The output CL_OUT of the comparator CMP2 is input to the gate terminal of the transistor M13 connected in parallel with the primary-side transistor M11 of the current mirror circuit CM1 of the control circuit 12. When the output CL_OUT of the comparator CMP2 becomes high level, the transistor M13 is turned on, and the current flowing through the transistors M11, M12 and the resistor R1 decreases. Accordingly, the voltage across the gate and source of the output transistor M1 decreases, and the output current Iout is limited such that the Iout is not equal to greater than a predetermined current value. That is, the comparator CMP2 and the transistor M13 constitute the current limit circuit 15.

The reference voltage Vref_CL of the current limit circuit 15 is set to be greater than the reference voltage Vref_OCP of the overcurrent detection circuit 14C. Thus, the current limit circuit 15 operates when the output current is greater than the current that activates overcurrent protection. In such a case, the element size (gate width) of the transistor M13 may be made smaller than that of the transistors M11, M12, for example. As a result, when the transistor M13 is turned on and the current IM13 flows through the transistor M13, a differential current (I3−IM13) that is a difference between the current IM13 and the current I3 of the constant current source CC3 flows through the transistors M11, M12. Accordingly, the gate terminal of the output transistor M1 is lower than the VDD, and the current clamped by the transistor M1 can flow. Instead, the value of the resistor R1 may be adjusted.

The retry circuit 16 includes: a constant current source CC2 connected in series to the transistor M2; a current mirror circuit CM2 that is constituted of N-channel MOS transistors M4, M5 and that receives, at its primary side, the current of the constant current source CC2; a current mirror circuit CM3 that is constituted of P-channel MOS transistors M7, M8 and that turns back the current in the secondary side of the current mirror circuit CM2; a transistor M6 connected in series to the transistor M8 of the current mirror circuit CM3; a transistor M3 connected in parallel with the transistor M6; a hysteresis comparator CMP3 that compares the drain voltage of the transistors M3, M6 and a predetermined reference voltage Vref_Retry; and an inverter INV3 that inverts the output of the comparator CMP3.

The output Retry_OUT of the inverter INV3 is input to: the gate terminal of the switch transistor M9 connected in parallel with the transistor M7 of the current mirror circuit CM3; and the NAND gate G1 of the logic circuit 11. The IC 10 further includes an external terminal PCT connected to a connecting node N1. The connecting node N1 connects the transistor M8 of the current mirror circuit CM3, the drain terminal of the transistor M3, and the drain terminal of the transistor M6. The external terminal PCT is connected to an external capacitor CT that constitutes a timer circuit.

In the high-side switch IC (or a linear regulator IC to be described later) under a steady state, when the level of the control terminal CE becomes high, the transistor M2 is kept turned on and the transistor M3 is kept turned off through the inverter INV1. When not in the overcurrent state, the output of the comparator CMP1 is at low level, the transistor M10 is turned on, and the current mirror circuit CM3 is turned off. As the current mirror circuit CM2 is turned on, the transistor M6 is also turned on, and the node N1 is at low level. The retry circuit 16 is not active. As the node N1 is at low level, the output of the comparator CMP3 is at low level, Retry_OUT is at high level, and the transistor M9 is turned off.

When in the overcurrent state, the current flowing through the external resistor Rsc increases, and the voltage Vsc of the terminal SC being input to the comparator CMP1 exceeds the voltage Vref_OCP. The output of the comparator CMP1 becomes high level, the transistor M10 is turned off, and the retry circuit 16 is activated. As the transistor M9 is turned off, the transistor M7 of the current mirror circuit CM3 is turned on, and the current Isource flows through the transistor M8. Then, the capacitor CT is charged by a differential current (Isource−Isink) that is a difference between the Isource and the Isink (<Isource) of the transistor M6. The potential of the node N1, which is equal to the potential VCT of the terminal PCT, gradually increases. When the potential VCT of the node N1 exceeds the reference voltage Vref_Retry, the output of the comparator CM3 becomes high level. This turns on the transistor M9, so that the current flowing through the transistors M7, M8 of the current mirror circuit CM3 is shut down.

The capacitor CT is then discharged by the current Isink of the transistor M6, so that the potential of the node N1 (i.e., potential VCT of the terminal PCT) gradually decreases. When the potential VCT of the terminal PCT becomes lower than the reference voltage Vref_Retry, the output of the comparator CMP3 becomes low level and turns off the transistor M9. Accordingly, a current flows through the transistors M7, M8 of the current mirror circuit CM3. By the repetition of the above operation, the potential VCT of the terminal PCT changes in a triangular waveform.

On the other hand, under the condition that the terminal CE is at high level, the output of the NAND gate G1 of the logic circuit 11 becomes high/low owing to the change of the output of the comparator CMP3. Accordingly, the transistor M14 of the control circuit 12 is turned on/off, and the output transistor M1 is turned on/off. That is, when the overcurrent detection circuit 14C detects an overcurrent, the retry circuit 16 intermittently performs an overcurrent protection operation, thereby restraining increase of chip temperature due to continuous overcurrent flow. After the overcurrent state is resolved, the circuit can automatically return to the steady operation.

Figure 2:
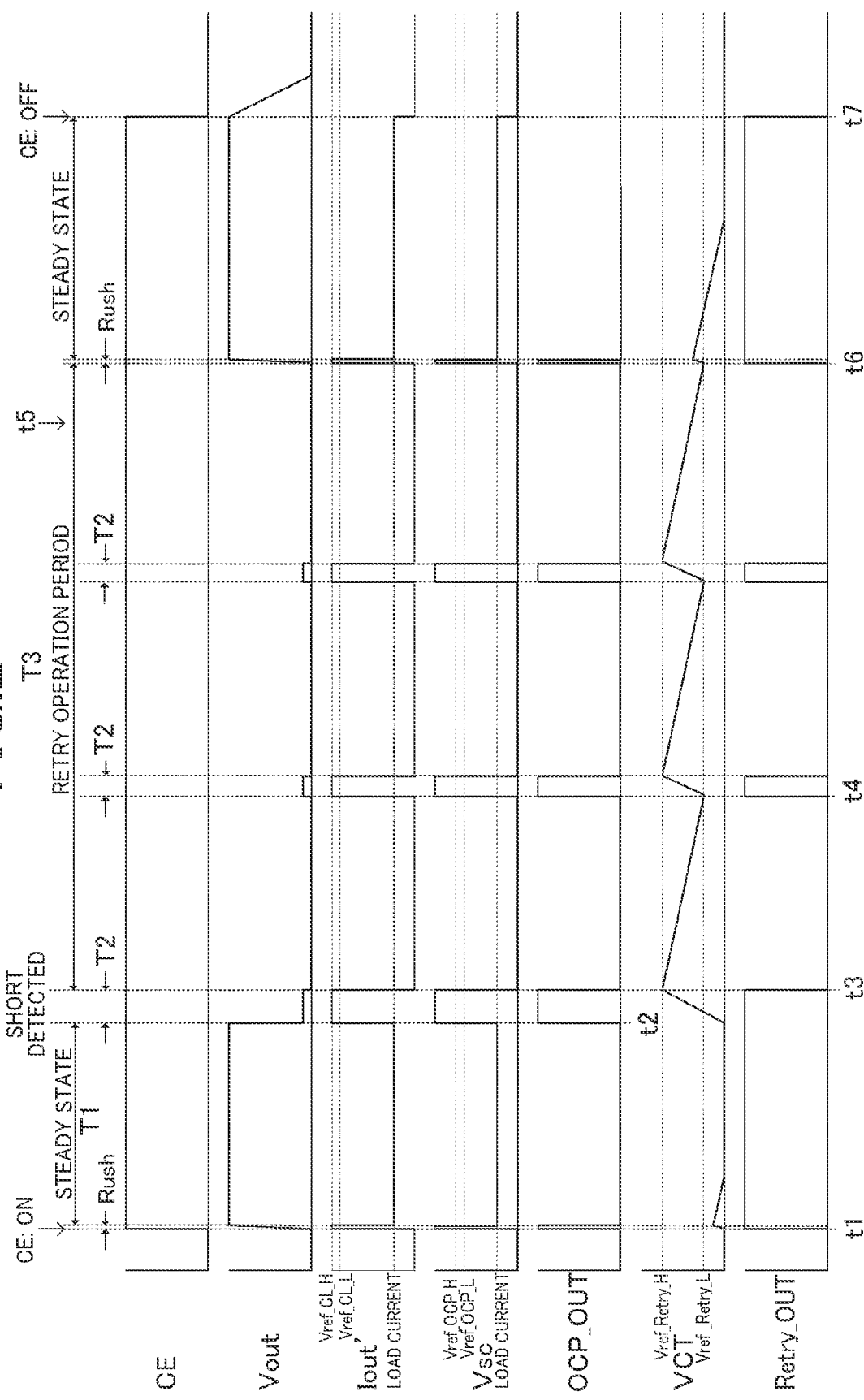
FIG. 2 is a timing chart showing operation timings of the internal circuit of the high-side switch IC in the embodiment.

Next, the operation of the internal circuit of the high-side switch IC 10 when a short circuit occurs at the output terminal OUT or the load is described with reference to the timing chart in FIG. 2. As the comparator CMP3 has hysteresis, the higher threshold voltage of the comparator CMP3 is called Vref_Retry_H, and the lower threshold voltage thereof is called Vref_Retry_L in the following description.

When the potential of the control terminal CE rises to high level at the timing t1, the output of the inverter INV1 becomes low level, the transistor M2 is turned on, and a current flows through the constant current source CC3. At the time, the output of the comparator CMP3 of the retry circuit 16 is at low level, and the output Retry_OUT of the inverter INV3 is at high level. Therefore, the output of the NAND gate G1 becomes low level, and the transistor M14 is turned off. As a result, a current flows through the current mirror circuit CM1 of the control circuit 12 and the resistor R1. The gate voltage of the output transistor M1 decreases, and the transistor M1 is turned on. Accordingly, the IC 10 is in a steady state T1 in which the output current Iout flows and the output voltage Vout rises.

In the steady state T1, when a short circuit occurs at the output side, the output current Iout and the proportional current Iout' generated by the proportional current generation circuit 14A increase. The overcurrent protection circuit 14 and the current limit circuit 15 detect the overcurrent state, and the output OCP_OUT of the comparator CMP1 and the output CL_OUT of the comparator CMP2 become high level (timing t2). The transistor M10 is then turned off by the output OCP_OUT of the comparator CMP3 of the retry circuit 16, and the transistor M7 of the current mirror circuit CM3 is turned on. The current Isource flows through the transistor M8, and the differential current (Isource−Isink) as a difference between the current Isource and the current Isink (<Isource) of the transistor M6 charges the capacitor CT. Accordingly, the potential of the node N1 (i.e., potential VCT of the terminal PCT) gradually increases (period T2).

When the potential VCT of the terminal PCT reaches the reference voltage Vref_Retry_H (timing t3), the output of the comparator CMP3 becomes high level, and the output Retry_OUT of the inverter INV3 becomes low level. The transistor M9 is turned on, and the current flowing through the transistors M7, M8 of the current mirror circuit CM3 is shut down. The capacitor CT is then discharged by the current Isink of the transistor M6, and the potential VCT of the terminal PCT gradually decreases (period between t3 and t4).

Thereafter, when the potential VCT of the terminal PCT reaches the reference voltage Vref_Retry_L (timing t4), the output of the comparator CMP3 becomes low level, and the output Retry_OUT of the inverter INV3 becomes high level. The transistor M9 is turned off, a current flows through the transistors M7, M8 of the current mirror circuit CM3, and the capacitor CT is charged. By the repetition of the above operation, the potential VCT of the terminal PCT changes in a triangular waveform (retry operation period T3). In the period T2 during which the potential VCT of the terminal PCT increases and a short circuit is detected, a current temporarily flows through the output transistor M1 and slightly increases the output voltage Vout.

Assume that the short-circuit state is resolved at the timing t5. In the case, the output Retry_OUT of the inverter INV3 becomes high level at the timing t6 when the potential VCT of the terminal PCT reaches the reference voltage Vref_Retry_L; the transistor M9 is turned off; a current flows through the transistors M7, M8 of the current mirror circuit CM3; the output transistor M1 is turned on; and the output voltage Vout increases to a steady state. The steady state is maintained until the potential of the control terminal CE decreases at the timing t7.

Although a large rush current flows toward the output terminal immediately after the output transistor M1 is turned on, the rush current flows for a short period of time. Therefore, even when a current that charges the capacitor CT flows in the retry circuit 16, the output OCP_OUT of the comparator CMP1 in the overcurrent protection circuit 14 falls before the potential VCT of the terminal PCT reaches the reference voltage Vref_Retry. Accordingly, the transistor M10 is turned on and the retry circuit 16 stops operation. In other words, the value of the capacitor CT is set such that the time measured by the timer circuit is longer than the time during which the rush current flows. Thus, when a rush current flows in activating the IC, the IC 10 can avoid wrongly detecting an overcurrent and activating the overcurrent protection function.

When the output Retry_OUT of the inverter INV3 becomes high level at the timings t1 and t6, the output of the NAND gate G1 becomes high level and keeps the level. The transistor M14 of the control circuit 12 is turned off, currents keep flowing through the transistors M11, M12 of the current mirror circuit CM1 and the resistor R1, and the transistor M1 is kept turned on. Accordingly, the output voltage Vout reaches a steady state.

Figure 3:
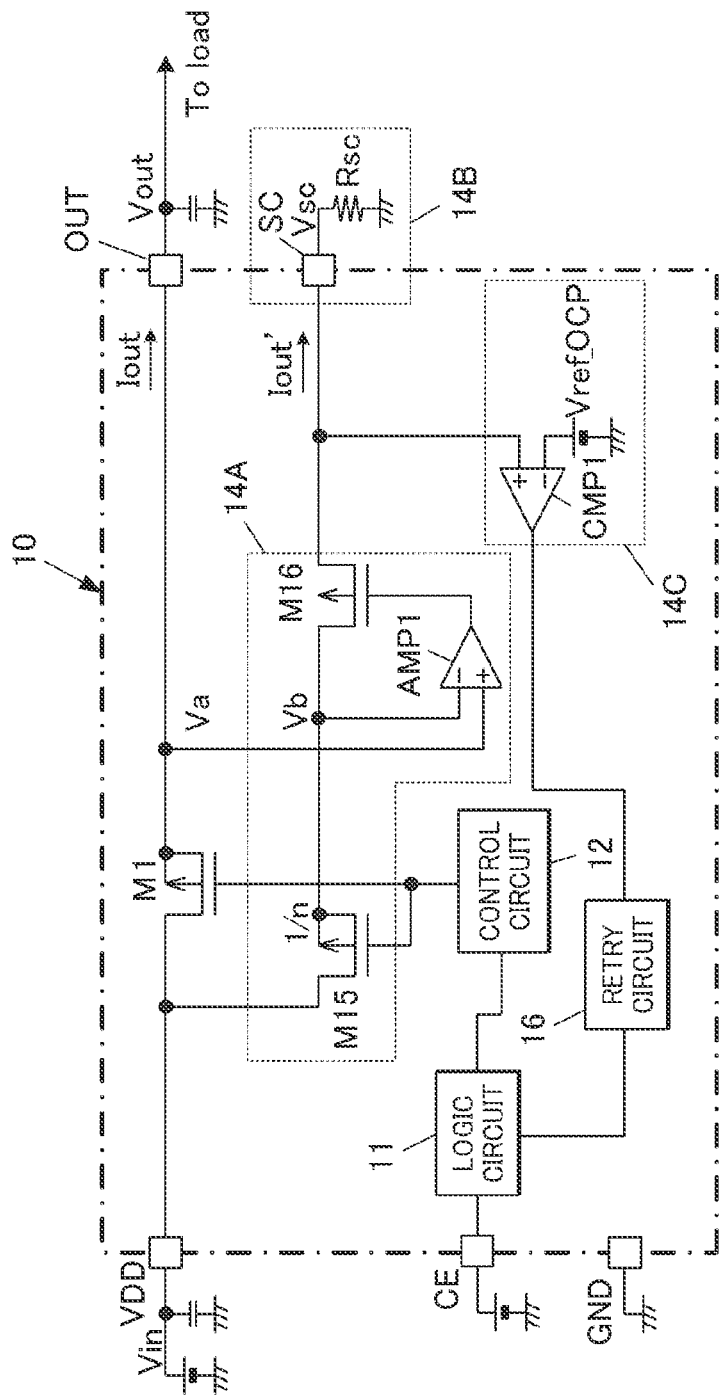
FIG. 3 is a circuit diagram showing a specific example of an overcurrent detection circuit constituting the high-side switch IC in the embodiment.

FIG. 3 shows a specific circuit example of the proportional current generation circuit 14A, which constitutes the overcurrent protection circuit 14. The reference voltage circuit 13 and the current limit circuit 15 are not illustrated in FIG. 3.

As shown in FIG. 3, the proportional current generation circuit 14A includes a P-channel MOS transistor M15, a differential amplifier AMP1, and a P-channel MOS transistor M16. The element size of the transistor M15 is 1/n of that of the output transistor M1. The source terminal of the transistor M15 is connected to the source terminal of the transistor M1. The same voltage is applied to the gate terminal of the transistor M15 and the gate terminal of the transistor M1. The differential amplifier AMP1 receives the drain voltage Va of the transistor M1 and the drain voltage Vb of the transistor M15 as inputs. The transistor M16 is connected between the drain terminal of the transistor M15 and the external terminal SC. The gate terminal of the transistor M16 receives the output voltage of the differential amplifier AMP1. The transistor M1 may consist of multiple transistors (n transistors) of the same size connected in parallel, and the transistor M15 may consist of a single transistor.

The differential amplifier AMP1 operates the transistor M16 such that the drain voltage Vb of the transistor M15 is equal to the drain voltage Va of the transistor M1. More specifically, the differential amplifier AMP1 controls the gate voltage of the transistor M16 according to the potential difference between the drain voltage Va of the transistor M1 and the drain voltage Vb of the transistor M15. The drain current of the transistor M16 increases/decreases according to the potential difference between Va and Vb. With feedback of the increase/decrease, the drain current of the transistor M15 changes. Accordingly, the voltage Vb becomes equal to the voltage Vb.

When the voltage Vb is equal to the voltage Va, the transistors M15 and M1 have the equal source voltage, equal drain voltage, and equal gate voltage. As a result, the drain current of the transistor M15, or the current Iout' flowing from the external terminal SC to the external resistor element Rsc, is proportionally smaller than the output current Iout according to the size ratio of the transistor M15 to the transistor M1. When the current Iout' flows through the resistor element Rsc, the voltage Vsc across the resistor element Rsc is input to the comparator CMP1 that detects an overcurrent. Thus, the comparator CMP1 can detect the overcurrent state of the output current Iout.

Second Embodiment

Figure 4:
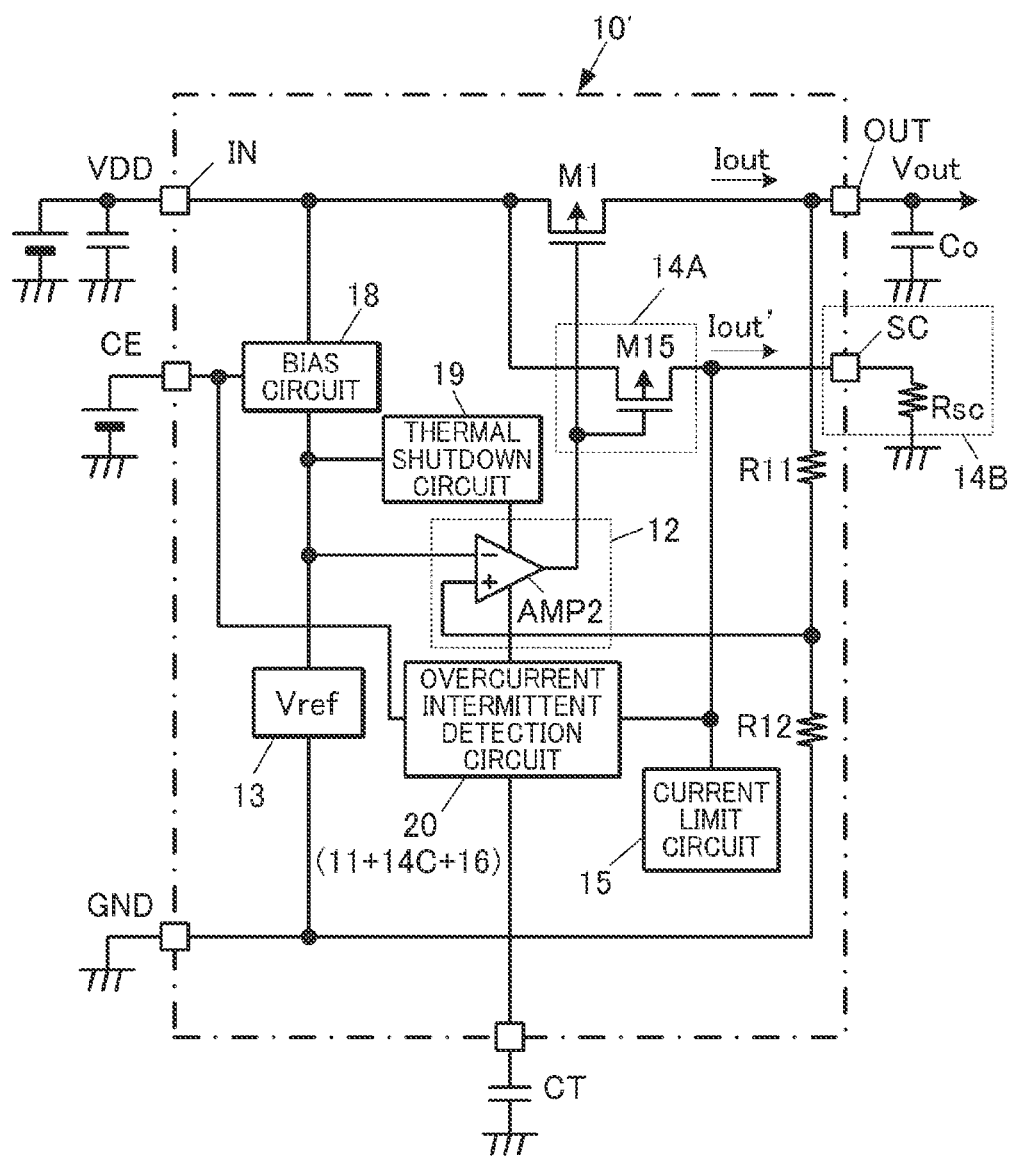
FIG. 4 is a circuit configuration of a linear regulator IC as an embodiment of the present invention.
Figure 5A:
FIG. 5A shows a voltage-current characteristic of an overcurrent protection circuit having a dropping characteristic.
Figure 5B:
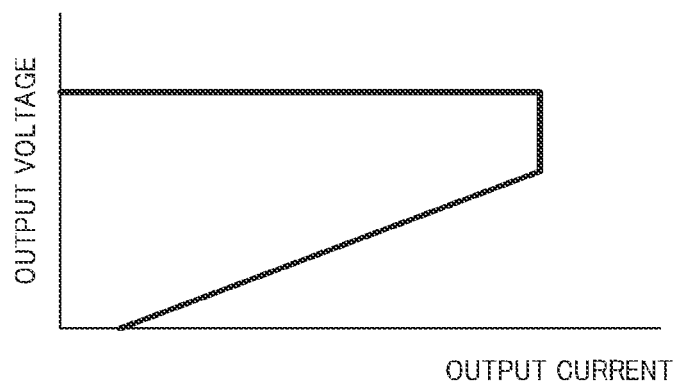
FIG. 5B shows a voltage-current characteristic of an overcurrent protection circuit having a foldback characteristic.

FIG. 4 is an embodiment of a linear regulator IC as a power supply IC to which the present invention is applied. In FIG. 4, the region enclosed by the alternate long and short dash line is a semiconductor integrated circuit (IC) 10' formed on a semiconductor chip, such as a single crystal silicon. The output terminal OUT of the IC 10' is connected to a capacitor Co for stabilizing output. The IC 10' functions as a DC power supply device that supplies a stable DC voltage.

As shown in FIG. 4, the linear regulator IC 10' in this embodiment includes: a voltage-control P-channel MOS transistor M1 connected between a voltage input terminal IN to which a DC voltage VDD is applied and a voltage output terminal OUT; and bleeder resistors R11, R12 that divide an output voltage Vout and that are connected in series between the output terminal OUT and a ground terminal GND. A ground potential is applied to the GND.

The voltage VFB divided by the resistors R1, R2 for dividing the output voltage is applied as a feedback to a non-inverting input terminal of an error amplifier AMP2. The error amplifier AMP2 serves as a control circuit 12 that controls the gate terminal of the output transistor M1. On the basis of the potential difference between the feedback voltage VFB of the output and a predetermined reference voltage Vref, the error amplifier AMP2 controls the output transistor M1 such that the output voltage Vout is at a desired potential.

The linear regulator IC 10' in this embodiment further includes: a reference voltage circuit 13 that generates the reference voltage Vref to be applied to the inverting input terminal of the error amplifier AMP2; a current limit circuit 15; a bias circuit 18 that sends operation currents to the error amplifier AMP2 and the reference voltage circuit 13; a thermal shutdown circuit 19 that stops operation of the error amplifier AMP2 to turn off the transistor M1 when the chip temperature is equal to or higher than a predetermined temperature; and an overcurrent intermittent detection circuit 20. The CE is an external terminal to which signals for turning on/off operations of the IC are input. The bias circuit 18 can be constituted of a current mirror circuit, for example.

The overcurrent intermittent detection circuit 20 includes the logic circuit 11, the overcurrent detection circuit 14C constituting the overcurrent protection circuit 14, and the retry circuit 16, which are included in the high-side switch IC shown in FIG. 1. The overcurrent intermittent detection circuit 20 is functionally equivalent to the circuits 11, 14C, and 16.

The linear regulator IC 10' in this embodiment further includes a transistor M15 as a proportional current generation circuit constituting the overcurrent protection circuit. The transistor M15 is connected in parallel with the output transistor M1. The gate terminal of the transistor M15 receives the output voltage of the error amplifier AMP2, which is also applied to the gate terminal of the output transistor M1. The transistors M15 and M1 form a current mirror circuit. The size (gate width) of the transistor M15 is 1/n of that of the output transistor M1, so that the drain current of the transistor M15 is 1/n of the drain current of the transistor M1.

The drain terminal of the transistor M15 is connected to the external terminal SC for connecting the resistor Rsc. The resistor Rsc converts currents into voltages outside the chip.

In the linear regulator IC 10' of this embodiment as configured above, the overcurrent intermittent detection circuit 20 operates in a similar way as the logic circuit 11, the overcurrent detection circuit 14C, and the retry circuit of the high-side switch IC shown in FIG. 1. When an overcurrent state occurs, the overcurrent intermittent detection circuit 20 protects the IC chip by performing the overcurrent protection operation of intermittently turning off the overcurrent detection operation and the output transistor M1. When the overcurrent state is resolved, the overcurrent intermittent detection circuit 20 can detect the state and automatically return to the steady state.

The linear regulator IC 10' in this embodiment includes the thermal shutdown circuit 19. When the chip temperature increases while the intermittent detection operation and the protection operation are repeated, or when a malfunction occurs in the retry circuit 16, the thermal shutdown circuit 19 is activated and turns off the output transistor M1. This enables double protection of the IC chip.

According to the present invention, a semiconductor integrated circuit device that includes a transistor connected between a voltage input terminal and an output terminal and an overcurrent protection circuit (e.g., high-side switch IC and a power supply IC) can shut down the output current before the power dissipation exceeds the allowable power dissipation, without relying on the overheat protection function. Further, the semiconductor integrated circuit device can automatically return to its steady state when the overcurrent state is resolved. Thus, the device can protect the chip. Such a configuration can be easily applied to a semiconductor integrated circuit device, such as a known high-side switch IC or a power supply IC. Further, as an advantageous effect of the present invention, the semiconductor integrated circuit device does not shut down the output current as a result of wrongly detecting a temporal rush current as an overcurrent. The temporal rush current flows when the device is activated and the output transistor is turned on, and charges a stabilizing capacitor connected to the output terminal to a predetermined voltage.

Further, the time measured by the timer circuit can be set as desired with the external capacitor connected to the external terminal. This increases usability of the device.

Further, when the output current has a value greater than a current value for the overcurrent detection circuit to determine the overcurrent state, the current limit circuit shuts down the output current by turning off the output transistor. This can prevent abnormal increase of chip temperature.

Further, when the chip temperature abnormally increases owing to a longer period of time during which the output transistor is repeatedly turned on and off by the signal output from the retry circuit, the device shuts down the output current by turning off the output transistor. Thus, the device can prevent abnormal increase of the chip temperature to protect the chip.

Although the present invention has been described in detail on the basis of the embodiments, the present invention is not limited to the above embodiments. For example, although the high-side switch IC 10 shown in FIG. 1 does not include the thermal shutdown circuit 19, the high-side switch IC 10 may include the thermal shutdown circuit 19 as with the linear regulator IC 10' shown in FIG. 4. Conversely, the linear regulator IC shown in FIG. 4 can be configured not to include the thermal shutdown circuit 19.

In the embodiments, the transistors constituting internal circuits of the high-side switch IC 10 and the linear regulator IC 10' are MOS transistors. However, bipolar transistors may be used instead of MOS transistors. Further, the capacitor CT may not be an external element but may be formed on the IC chip. Further, the output MOS transistor M1 may be either P-channel or N-channel.

Further, the high-side switch IC 10 and the linear regulator IC 10' may include a detection signal output circuit and an external terminal. The detection signal output circuit and the external terminal are for outputting detection signals to the outside when the overcurrent detection circuit 14C detects an overcurrent, or when the current limit circuit 15 or the thermal shutdown circuit 19 detects abnormal current or abnormal chip temperature.

Further, although the present invention is applied to a high-side switch IC 10 and a linear regulator IC 10' in the above embodiments, the present invention is not limited to these ICs. The present invention is widely applicable to a semiconductor integrated circuit device that includes a transistor connected between a voltage input terminal and a voltage output terminal, such as an IC for charging a secondary battery.

What is claimed is:

1. A semiconductor integrated circuit device, comprising:
an output transistor connected between a voltage input terminal to which a DC voltage is input and a voltage output terminal;
a control circuit that controls on/off of the output transistor;
an overcurrent detection circuit configured to detect an overcurrent state of an output current by determining whether a current equal to or greater than a first predetermined current value flows through the output transistor, based on the current flowing through the output transistor;
a retry circuit that includes a timer circuit using charging and discharging by a capacitor and that generates and outputs a signal for intermittently turning off the output transistor in response to the overcurrent detection circuit detecting the overcurrent state continuously for a first period of time; and
a first external terminal,
wherein:
the timer circuit includes a constant current source, a current mirror circuit that copies a current from the constant current source, the capacitor that is charged and discharged by a current from the current mirror circuit and that is connected to the first external terminal as an external capacitor, and a comparator whose input is connected to the first external terminal,
the first period which is set by a capacitance value of the capacitor is longer than a period during which a rush current flows, the rush current flowing immediately after the output transistor is turned on,
the timer circuit starts measuring a time of the capacitor charged by the constant current source in response to the overcurrent state being detected, and, when the first period has elapsed, the output transistor changes from on to off, and when a second period has elapsed, the output transistor changes from off to on, and the control circuit repeats control of turning on and off the output transistor until the overcurrent state is resolved, and the current mirror circuit turns off and on by output signal of the comparator.

2. The semiconductor integrated circuit device according to claim 1, further comprising:
a second external terminal for receiving a predetermined signal; and
a logic circuit that receives the signal input to the first external terminal and the signal output by the timer circuit,
wherein the control circuit controls the output transistor, based on a signal output by the logic circuit.

3. The semiconductor integrated circuit device according to claim 1, further comprising a current limit circuit that limits the output current of the output transistor such that the output current is not equal to or greater than a second predetermined current value,
wherein the second predetermined current value for the current limit circuit to be activated is greater than the first predetermined current value for the overcurrent detection circuit to detect the overcurrent state.

4. The semiconductor integrated circuit device according to claim 1, further comprising a thermal shutdown circuit that generates and outputs a signal for turning off the output transistor in response to a chip temperature being equal to or higher than a predetermined temperature.

5. The semiconductor integrated circuit device according to claim 1, further comprising a proportional current generation circuit configured to generate a current proportionally smaller than a current flowing though the output transistor,
wherein the overcurrent detection circuit detects the overcurrent state of the output current by determining whether the current flowing through the output transistor is equal to or greater than the first predetermined current value, based on the current generated by the proportional current generation circuit.

6. The semiconductor integrated circuit device according to claim 5,
wherein the semiconductor integrated circuit device is a high-side switch,
wherein the proportional current generation circuit includes:
a first transistor connected in parallel with the output transistor, a control terminal of the first transistor receiving a signal identical to a control signal applied to a control terminal of the output transistor;
a second transistor and a current-voltage converter connected between the voltage input terminal and a grounding point so as to be in series to the first transistor; and
a differential amplifier circuit that receives as inputs a potential at an output side of the output transistor and a potential at a connecting node between the first transistor and the second transistor, and
wherein an output of the differential amplifier circuit is applied to a control terminal of the second transistor, and a voltage converted from a current by the current-voltage converter is supplied to the overcurrent detection circuit.

7. The semiconductor integrated circuit device according to claim 6, further comprising a third external terminal,
wherein the current-voltage converter includes an external resistor element connected to the third external terminal.

8. The semiconductor integrated circuit device according to claim 1, wherein;
the timer circuit includes a third transistor connecting the current mirror circuit in series, and a current flowing through the third transistor, and
a ratio of the first time and the second time is based on the current source and the current from the third transistor.

9. The semiconductor integrated circuit device according to claim 8, wherein:
the current mirror circuit includes a first current mirror and a second current mirror connected to the first current mirror, and
the first current mirror connecting to constant current source and the second current mirror connecting to the third transistor.

10. The semiconductor integrated circuit device according to claim 1, wherein, a first time of the output transistor turning on is less than 50% of a second time of the output transistor turning off.

11. A semiconductor integrated circuit device, comprising:
an output transistor connected between a voltage input terminal to which a DC voltage is input and a voltage output terminal;
a control circuit that controls on/off of the output transistor;
a proportional current generation circuit configured to generate a current proportionally smaller than a current flowing through the output transistor;
an overcurrent detection circuit configured to detect an overcurrent state of an output current by determining whether a current flowing through the output transistor is equal to or greater than a first predetermined current value, based on the current generated by the proportional current generation circuit;
a retry circuit that generates and outputs a signal for intermittently turning off the output transistor in response to the overcurrent detection circuit detecting the overcurrent state;
a first external terminal for receiving a predetermined signal;
a logic circuit that receives the signal input to the first external terminal and the signal output by the retry circuit; and
a second external terminal,
wherein:
the control circuit controls the output transistor, based on the signal output by the retry circuit,
the control circuit controls the output transistor, further based on a signal output by the logic circuit,
the retry circuit includes a timer circuit,
the timer circuit includes, a constant current source, a current mirror circuit that copies a current from the constant current source, a capacitor that is charged and discharged by a current from the current mirror circuit, and a comparator whose input is connected to the second external terminal, wherein the timer circuit starts measuring a time of the capacitor charged by the constant current source in response to the overcurrent detection circuit detecting the overcurrent state and outputs a signal to the logic circuit when a predetermined period of time has elapsed, the logic circuit supplies the control circuit with the signal for turning on and off the output transistor until the overcurrent state is resolved, the capacitor includes an external capacitor connected to the second external terminal, and the current mirror circuit turns off and on by output signal of the comparator.

12. The semiconductor integrated circuit device according to claim 11, further comprising a current limit circuit that limits the output current of the output transistor to less than a second predetermined current value, wherein the second predetermined current value for the current limit circuit to be activated is greater than the first predetermined current value for the overcurrent detection circuit to detect the overcurrent state.

13. The semiconductor integrated circuit device according to claim 11, wherein the semiconductor integrated circuit device is a high-side switch, wherein the proportional current generation circuit includes:

a first transistor connected in parallel with the output transistor, a control terminal of the first transistor receiving a signal identical to a control signal applied to a control terminal of the output transistor;

a second transistor and a current-voltage converter connected between the voltage input terminal and a grounding point so as to be in series to the first transistor; and a differential amplifier circuit that receives as inputs a potential at an output side of the output transistor and a potential at a connecting node between the first transistor and the second transistor, and wherein an output of the differential amplifier circuit is applied to a control terminal of the second transistor, and a voltage converted from a current by the current-voltage converter is supplied to the overcurrent detection circuit.

14. The semiconductor integrated circuit device according to claim 13, further comprising a third external terminal, wherein the current-voltage converter includes an external resistor element connected to the third external terminal.

15. The semiconductor integrated circuit device according to claim 11, further comprising a thermal shutdown circuit that generates and outputs a signal for turning off the output transistor in response to a chip temperature being equal to or higher than a predetermined temperature.

16. The semiconductor integrated circuit device according to claim 11, wherein:

the timer circuit includes a third transistor connecting the current mirror circuit in series, and a current flowing through the third transistor, and a ratio of the first time and the second time is based on the current source and the current from the third transistor.

17. The semiconductor integrated circuit device according to claim 16, wherein:

the current mirror circuit includes a first current mirror and a second current mirror connected to the first current mirror, and the first current mirror connecting to constant current source and the second current mirror connecting to the third transistor.

18. The semiconductor integrated circuit device according to claim 11, wherein, a first time of the output transistor turning on is less than 50% of a second time of the output transistor turning off.

* * * * *